(12) United States Patent
Kwan

(10) Patent No.: US 9,437,815 B1
(45) Date of Patent: Sep. 6, 2016

(54) RESISTIVE SWITCHING MEMORY DEVICE ARCHITECTURE FOR REDUCED CELL DAMAGE DURING PROCESSING

(71) Applicant: Adesto Technologies Corporation, Sunnyvale, CA (US)

(72) Inventor: Ming Sang Kwan, San Leandro, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 69 days.

(21) Appl. No.: 14/265,548

(22) Filed: Apr. 30, 2014

(51) Int. Cl.
*G11C 11/406* (2006.01)
*H01L 45/00* (2006.01)

(52) U.S. Cl.
CPC ........... *H01L 45/1253* (2013.01); *H01L 45/16* (2013.01)

(58) Field of Classification Search
CPC ............. H01L 45/1233; H01L 45/085; H01L 27/2436; H01L 27/2409; H01L 45/146; H01L 45/144
USPC ................................................. 710/301, 313
See application file for complete search history.

(56) References Cited

U.S. PATENT DOCUMENTS

| | | | |
|---|---|---|---|
| 7,333,367 B2 | 2/2008 | Lee et al. | |
| 7,382,647 B1 * | 6/2008 | Gopalakrishnan | G11C 11/16 365/100 |
| 7,688,622 B2 | 3/2010 | Kang et al. | |
| 8,374,018 B2 * | 2/2013 | Lu | G11C 13/0002 257/2 |
| 8,995,167 B1 * | 3/2015 | Kim | G11C 13/0069 365/148 |
| 2005/0007852 A1 * | 1/2005 | Moore | G11C 11/406 365/222 |
| 2012/0044747 A1 * | 2/2012 | Chung | G11C 17/06 365/148 |
| 2013/0126819 A1 * | 5/2013 | Satoh | H01L 45/06 257/4 |
| 2014/0173154 A1 * | 6/2014 | Sunkavalli | G11C 13/0011 710/301 |

* cited by examiner

*Primary Examiner* — Mary Wilczewski
*Assistant Examiner* — Tsz Chiu
(74) *Attorney, Agent, or Firm* — Michael C. Stephens, Jr.

(57) ABSTRACT

In one embodiment, a resistive switching memory device can include: (i) a plurality of resistive memory cells arranged in a plurality of array blocks, where each resistive memory cell is configured to be programmed to a low resistance state by application of a program voltage in a forward bias direction, and to be erased to a high resistance state by application of an erase voltage in a reverse bias direction; (ii) a plurality of anode plates corresponding to the plurality of array blocks, where each resistive memory cell can include a resistive storage element having an anode coupled to one of the anode plates; (iii) an inactive ring surrounding the plurality of anode plates, where the inactive ring can include a same material as each of the plurality of anode plates; and (iv) a plurality of boundary cells located under the inactive ring.

10 Claims, 12 Drawing Sheets

RESISTIVE SWITCHING MEMORY DEVICE ARCHITECTURE FOR REDUCED CELL DAMAGE DURING PROCESSING

FIELD OF THE INVENTION

The present invention generally relates to the field of semiconductor memory. More specifically, embodiments of the present invention pertain to resistive random-access memory (ReRAM) and/or conductive bridging RAM (CBRAM) processes and devices.

BACKGROUND

Non-volatile memory (NVM) is increasingly found in applications, such as solid-state hard drives, removable digital picture cards, and so on. Flash memory is the predominant NVM technology in use today. However, flash memory has limitations, such as a relatively high power, as well as relatively slow operation speed. Other NVM technologies, such as resistive switching memory technologies that include resistive RAM (ReRAM) and conductive bridging RAM (CBRAM), may offer relatively lower power and higher speeds as compared to flash memory technologies. For example, CBRAM utilizes a conductive bridging cell technology, which has the potential to scale to smaller sizes than flash memory devices.

SUMMARY

Embodiments of the present invention relate to a resistive switching memory device with diode selection. Particular embodiments are suitable for resistive switching memories, such as resistive random-access memory (ReRAM) and/or conductive bridging RAM (CBRAM) memory cells.

In one embodiment, a resistive switching memory device can include: (i) a plurality of resistive memory cells arranged in a plurality of array blocks, where each resistive memory cell is configured to be programmed to a low resistance state by application of a program voltage in a forward bias direction, and to be erased to a high resistance state by application of an erase voltage in a reverse bias direction; (ii) a plurality of anode plates corresponding to the plurality of array blocks, where each resistive memory cell can include a resistive storage element having an anode coupled to one of the anode plates; (iii) an inactive ring surrounding the plurality of anode plates, where the inactive ring can include a same material as each of the plurality of anode plates; and (iv) a plurality of boundary cells located under the inactive ring.

In one embodiment, a method of making a resistive switching memory device can include: (i) forming a plurality of resistive memory cells arranged in a plurality of array blocks, where each resistive memory cell is configured to be programmed to a low resistance state by application of a program voltage in a forward bias direction, and to be erased to a high resistance state by application of an erase voltage in a reverse bias direction; (ii) forming a plurality of anode plates corresponding to the plurality of array blocks, where each resistive memory cell can include a resistive storage element having an anode coupled to one of the anode plates; (iii) forming an inactive ring surrounding the plurality of anode plates, where the inactive ring can include a same material as each of the plurality of anode plates; and (iv) forming a plurality of boundary cells located under the inactive ring.

DETAILED DESCRIPTION OF EMBODIMENTS

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device, and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Example CBRAM Cell Structure and Arrangement

Particular embodiments may be directed to resistive switching memories (e.g., conductive bridging random-access memory [CBRAM], resistive RAM [ReRAM], etc.). The invention, in its various aspects, will be explained in greater detail below with regard to exemplary embodiments. Particular embodiments can include structures and methods of operating resistive switching memories that can be programmed/written and erased between one or more resistance and/or capacitive states. Resistive switching memory devices can include a plurality of resistive memory cells with "programmable impedance elements" or any type of resistive switching or resistance-change memory cells or elements.

Figure 1:
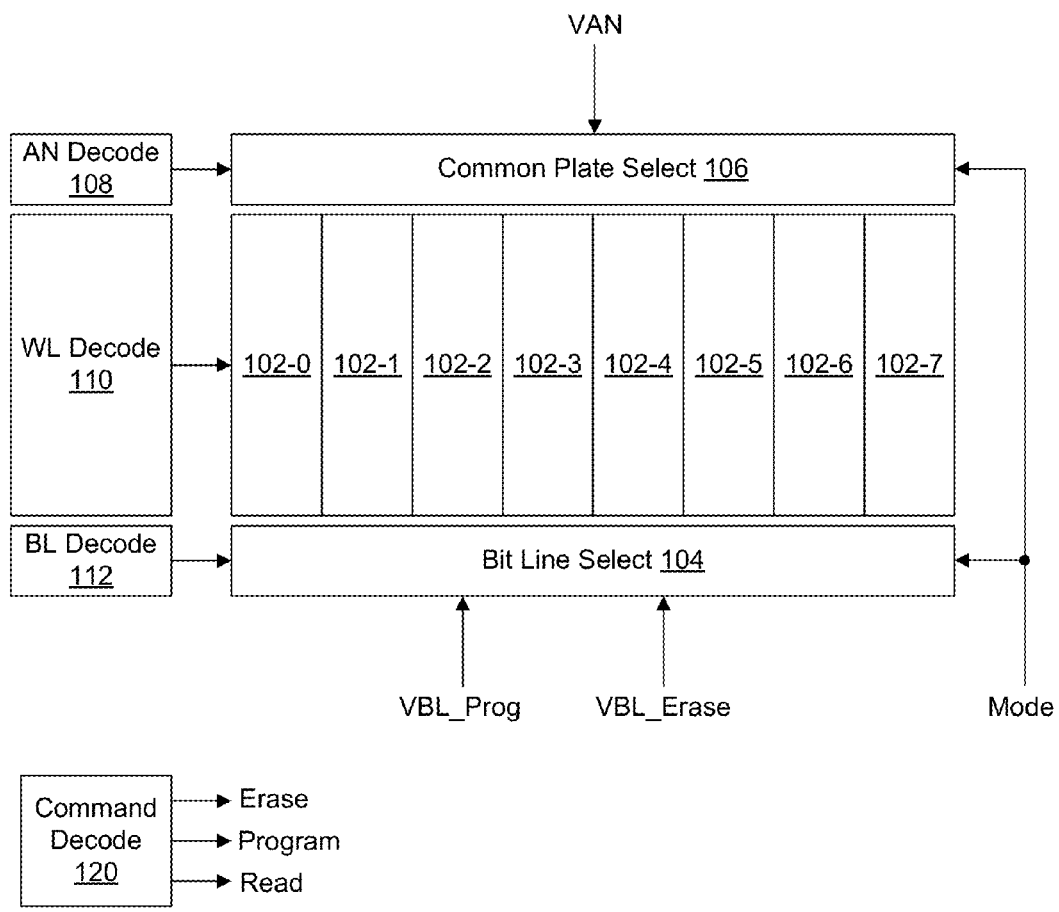
FIG. 1 is an example memory device arrangement.
Figure 2:
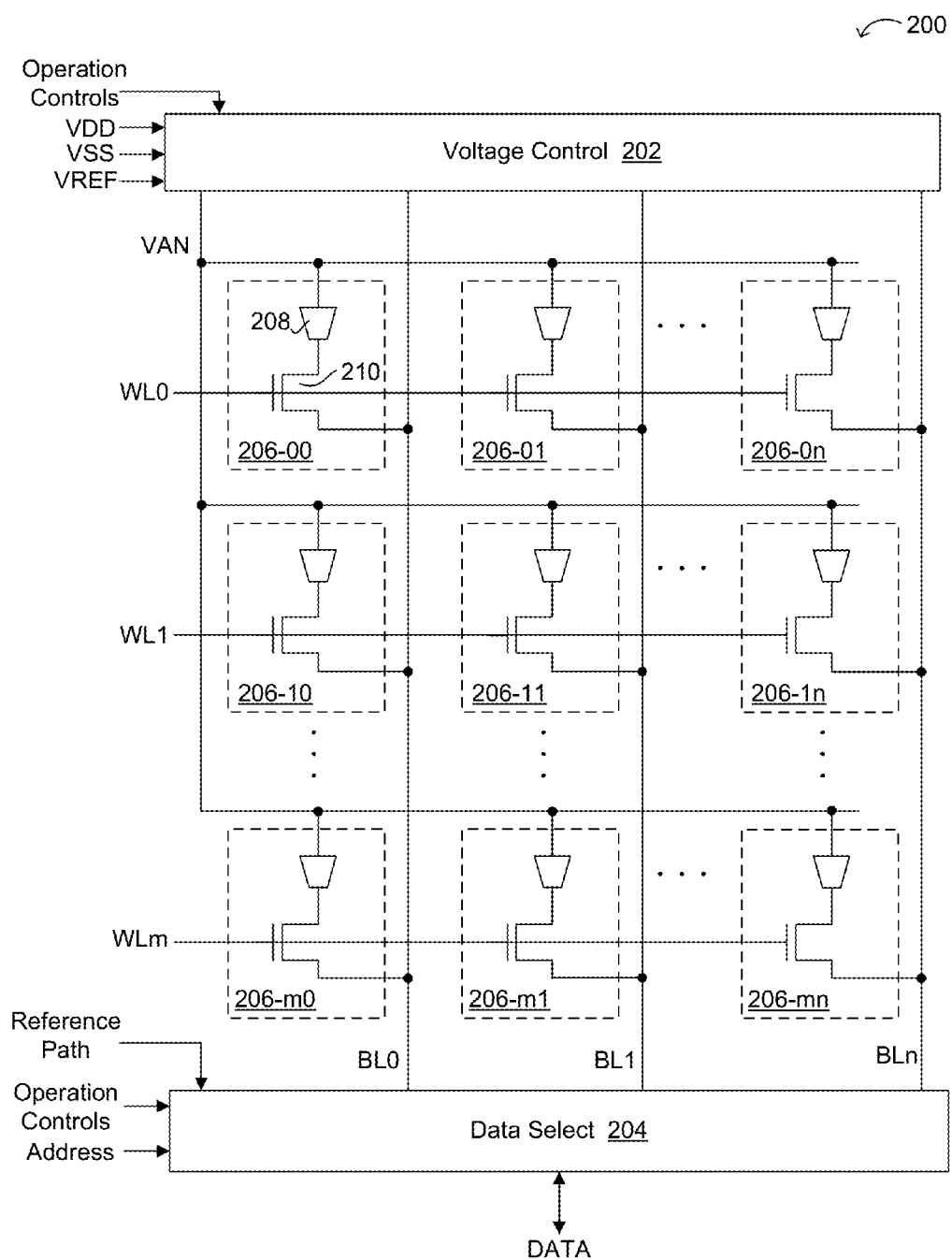
FIG. 2 is a schematic block diagram of an example common anode array structure.

FIGS. 1 and 2 show example memory architectures and circuit structures that can utilize programmable impedance elements. However, particular embodiments are amenable to a wide variety of memory architectures, circuit structures, and types of resistive switching memories.

Referring now to FIG. 1, an example memory device is shown and designated by the general reference character 100. A memory device 100 can include common anode sectors 102-0 to 102-7, bit line selection circuitry 104, common plate selection circuitry 106, anode decoding circuitry 108, word line decoding circuitry 110, and bit line decoding circuitry 112. A memory device 100 can be a single integrated circuit, or may form a portion of a larger integrated circuit device that provides functions in addition to memory, such as in an "embedded" memory configuration.

FIG. 1 may also include command decoding circuitry 120. For example, command decoding circuitry 120 may receive external signals, or control signals derived therefrom, and may generate various internal control signals (e.g., program, erase, read, etc.) in response. Such internal operation control signals can be used to generate various supply levels (e.g., particular program and erase voltage levels), as well as other control signals (e.g., erase operation control signals), as will be discussed in more detail below. In this way, command decoding circuitry 120 may be used to determine an operation to be performed on the device.

Common anode sectors (102-0 to 102-7) can each include a number of memory cells arranged into one or more columns and multiple rows, and coupled to a common anode plate. Each memory cell can include one or more programmable impedance elements or CBRAM storage elements, and a selection device. Generally, a CBRAM storage element may be configured such that when a bias greater than a threshold voltage is applied across electrodes of the CBRAM storage element, the electrical properties of the CBRAM storage element can change. For example, in some arrangements, as a voltage is applied across the electrodes of the CBRAM storage element, conductive ions within an ion conductor may begin to migrate and form an electrodeposit at or near the more negative of the electrodes. Such an electrodeposit, however, is not required to induce a change in electrical properties. The term "electrodeposit" as used herein means any area within the ion conductor that has an increased concentration of reduced metal or other conductive material compared to the concentration of such material in the bulk ion conductor material. As the electrodeposit forms, the resistance between the electrodes can decrease, and other electrical properties may also change. If a voltage is applied in reverse, the electrodeposit can dissolve back into the ion conductor and a device can return to a former electrical state (e.g., high resistance state).

Voltages VBL_Prog, VBL_Erase, and VAN may be conventional power supply voltages, such +5 and 0 volts, or +3.3 and 0 volts, or +1.2 and 0 volts. In one example, such voltages may be one or more power supply voltages received at an external pin of an integrated circuit including memory device 100. In another example, such voltages may be one or more voltages generated by a voltage regulator of an integrated circuit that includes memory device 100. In any event, such voltages may be used, either directly or indirectly, for programming (e.g., in a forward bias configuration) or erasing (e.g., in a reverse bias configuration) a CBRAM cell by applying suitable voltages across the electrodes thereof.

Bit line selection circuitry 104 can selectively connect bit lines of one or more common anode sections (102-0 to 102-7) according to a mode of operation and bit line decoding values. In one particular example, bit line selection circuitry 104 can advantageously connect a selected bit to either of voltages VBL_Prog or VBL_Erase. That is, in a program operation, a selected bit line can be connected to voltage VBL_Prog, while in an erase operation, a selected bit line can be connected to voltage VBL_Erase.

Common plate selection circuitry 106, can connect anode plates to an inhibit voltage for CBRAM cells that are not selected (e.g., via anode decode 108) for erase or program. It is noted that an arrangement like that shown in FIG. 1 can advantageously provide program and erase voltages without having to include charge pumps or the like, to a voltage that is outside a power supply range, as may exist in other approaches. Instead, supply voltages applied across a selected CBRAM device can be switched between program and erase operations. In this way, program and erase can be "symmetric" operations. That is, in a programming operation, a CBRAM cell to be programmed can be connected between suitable voltages (e.g., V1-V2) in an anode-to-cathode direction. In an erase operation, a CBRAM cell to be erased can be connected between suitable voltages (e.g., V2-V1) in a cathode-to-anode direction.

Bit line decoding circuitry 112 can generate values for selecting given bit lines for read, program, and erase operations. In one arrangement, in response to address information (e.g., column address data), bit line decoding circuitry 112 can generate bit line select signals for application to bit line select circuitry 104. Word line decoding circuitry 110 can generate values for selecting a given set of memory cells by enabling access devices in one or more selected rows of common anode sections (102-0 to 102-7). In response to address information (e.g., row address data), one or more word lines can be driven to a select voltage to thereby enable the corresponding select device (e.g., a transistor) in a row of memory cells.

Referring now to FIG. 2, shown is a schematic block diagram of an example common anode array structure 200, which can be one implementation of the example shown in FIG. 1. In this example, voltage control 202 can receive various supply voltages (e.g., VDD, VSS, VREF, etc.), as well as operation controls (e.g., program, erase, verify, read, etc.). Resistive memory cells 206 can include a programmable impedance element 208 and an access transistor 210, as shown. In this particular arrangement, the anode of each memory cell 206 can connect together in a common anode structure. For example, the common anode can be a large plate structure that may be biased at a voltage VAN generated by voltage control 202. Of course, other voltage generation control and regulated levels, as discussed above, can be utilized in certain embodiments.

Thus as shown in this particular example, common anode plates (VAN) can be shared by multiple CBRAM cells. Along these lines, each memory array or array block may have multiple such anode plates (VANs). In addition, word lines and bit lines can be arranged in an orthogonal fashion for accessing individual CBRAM or other such resistive memory cells. Of course, any number of anode plates, anode plate voltages (VANs), memory array or array block sizes, and/or memory array arrangements, etc., can be supported in particular embodiments.

In this example, data select 204 can provide an interface between the bit lines (BL0, BL1, . . . BLn) and a data path that is coupled to a sensing or amplification block, as well as to write circuitry. Address decoding can be used to determine which of the bit lines are mapped to the data lines in a particular access cycle. Other types of addressing or decoding (e.g., anode-based decoding) can also be employed. For example, the common anode structure as shown can be broken up into a plurality of sub blocks of common anodes, and each of these may be addressed and decoded. In addition, word line (WL0, WL1, . . . WLm) decoding can be utilized for activation of the appropriate word line for a given cycle.

Further, a reference path can also be coupled to data select 204. The reference path can be used by a sensing circuit in order to compare against a regular bit line. For example, a current from a selected bit line and its selected memory cell 206 can be compared against a current from a reference bit line, where the reference bit line is biased such that appropriate data states on the selected memory cell via the selected bit line can be detected. In one application, the capacitance on the reference bit line and reference memory cell structure can match the capacitance on a regular memory cell/bit line such that these effects are negated during the sensing process.

Other architectures can also be employed with sensing circuitry, arrangements, and methods of particular embodiments. For example, a common cathode structure, whereby a plurality of memory cells are coupled together via a common cathode connection, can be supported. In such a case, the access transistor may connect the anode to the corresponding bit line in a bit line anode arrangement. Also, cathode-based decoding can be used in such an arrangement. Another example architecture or memory cell arrangement is a strapped source structure. In any event, particular embodiments are suitable to a wide variety of resistive memory cell architectures and arrangements.

Data select 204 can also receive operation control signals. These signals can be used to set a read data path, a write data path, and sensing circuitry, as appropriate for the given command. For example, a read data path may be activated for a read operation, a program verify operation, or an erase verify operation. Also, a write data path may be activated for a program or erase operation. For example, a common bidirectional sensing circuit can be employed in each of these operations. In particular, the bidirectional sensing circuit can allow for a program verify to be performed using a same forward bias (anode voltage higher with respect to cathode voltage) on the memory cell as was used to program the memory cell. Similarly, the bidirectional sensing circuit can allow for an erase verify to be performed using a same reverse bias (cathode voltage higher with respect to anode voltage) on the memory cell as was used to erase the memory cell.

Sensing circuits in particular embodiments also aim to minimize disturbance of the accessed cell resistance during the read operation to determine a data state from that cell. Thus, a cell that is programmed (e.g., in a data state "0") should remain in that state after a program verify or standard read operation, and a cell that is erased (e.g., in a data state "1") should remain in that state after an erase verify or standard read operation. The CBRAM cell may generally be programmed with a forward bias voltage (positive with respect to anode and cathode), and may be erased with a reverse bias voltage (negative with respect to anode and cathode). Various voltages for bit lines and the common anode plate can be supported in particular embodiments. Voltages can also be changed depending on the bias direction (forward or reverse) for a read operation.

Having described the various sections of FIG. 2, one example of the operation of such a memory device will now be described with reference to an operation that accesses memory cell 206-00. Initially, word lines WL0, WL1, . . . WLm can be driven to a deselect voltage (e.g., low) by associated word line drivers. Bit line selection circuitry 104 can place bit lines BL0 and BL1 in the deselected state. Similarly, common plate selection circuitry 106 can place common anode plates in the deselected state.

In a program operation, in response to address and mode data, bit line selection signals can be used to connect a selected bit line to read/write control circuitry via data select 204. In contrast, other bit lines can be deselected, and thus placed in the deselected state. Mode selection values can result in read/write control circuitry connecting the selected bit line (e.g., BL0) to a cathode program voltage. A program operation can also include anode plate voltage VAN being connected to a program voltage, while connecting the selected bit line is grounded. A word line driver corresponding to the selected memory cell can be driven to a select voltage, thereby placing the selected memory cell between suitable programming voltages.

An erase operation can occur in the same general fashion, but with the erase voltage being applied to the selected bit line and common anode voltage VAN. As noted in the example of FIG. 1, in particular embodiments, such an operation can be symmetrical. Also, while FIG. 2 shows n-channel MOS transistors 210 as access devices, other embodiments may include different types of access devices. In such alternate embodiments, associated word line drivers would provide appropriate voltage and/or currents to enable such access devices. In this way, bit line selection, anode plate selection, and word line activation can be utilized to program and/or erase a CBRAM array having bit lines connected to cathodes of CBRAMs within multiple memory cells.

While particular example architectures and circuits suitable for CBRAMs, and memory arrays formed thereof, with respect to FIGS. 1 and 2, programmable impedance elements in certain embodiments are suitable to a wide variety of architectures and/or circuit arrangements.

Figure 3:
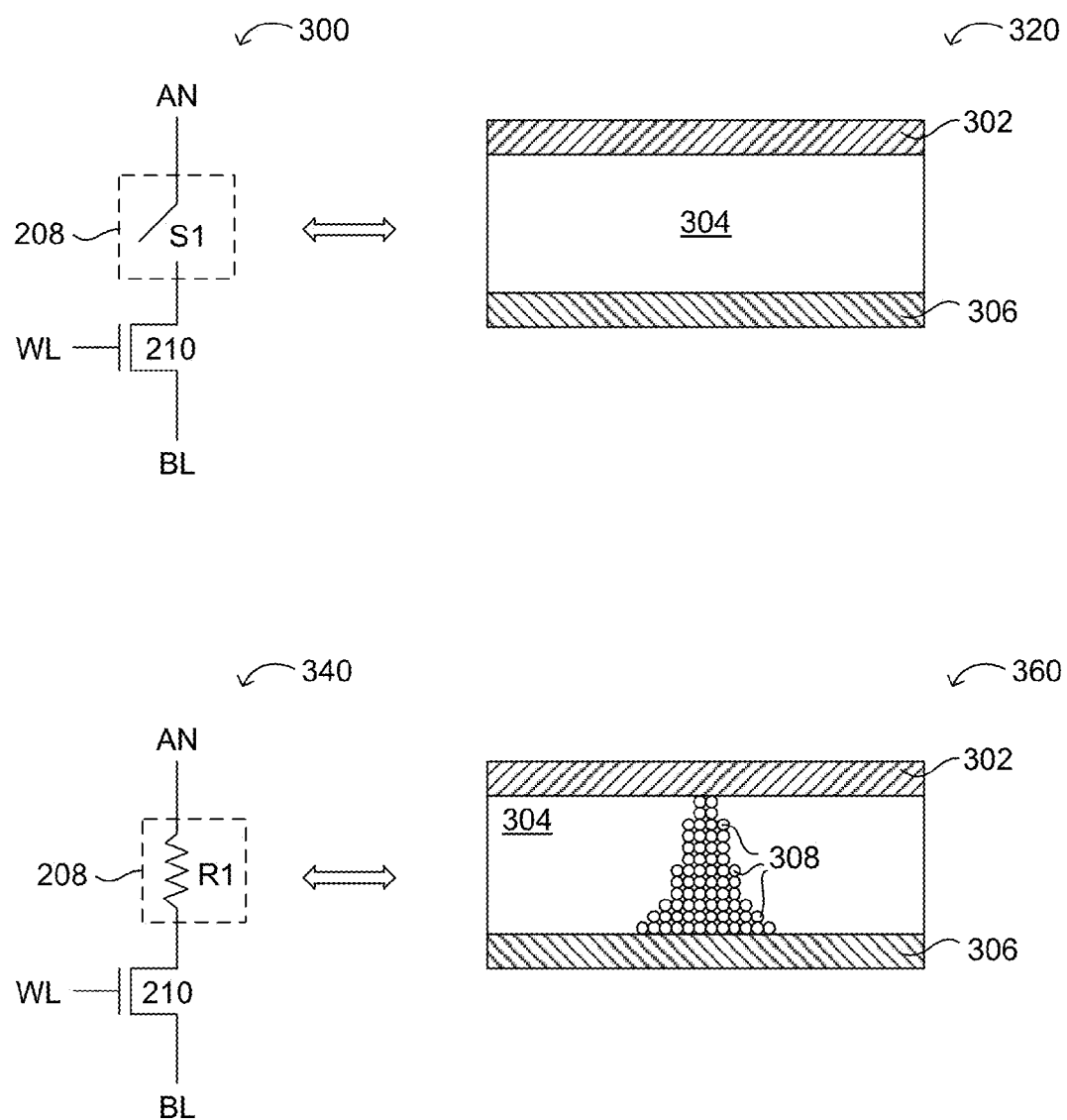
FIG. 3 is a diagram of an example programmable impedance element with schematic modeling.

Referring now to FIG. 3, shown is a diagram of an example programmable impedance element with schematic modeling. For example, example 300 shows a memory cell with an open switch 51 representation of programmable impedance element 208. The programmable impedance element or CBRAM storage element portion of this representation corresponds to the cross-section diagram 320, which represents a resistive storage element in a high impedance state (e.g., data state "1"), or an erased state. Particular embodiments can also include any type of resistive switching or resistance-change memory cells or elements. In one example, CBRAM storage element 320 can include electrochemically active electrode 302, solid electrolyte 304, and inert electrode 306. The example CBRAM storage element 320 may represent a strong or substantially erased state of the cell. As shown, substantially no conductive path between active electrode 302 and inert electrode 306 is seen in CBRAM storage element 320.

Schematic representation 340 and corresponding cross-section diagram 360 show examples of CBRAM storage element 208 in a low impedance state (e.g., data state "0"), or a programmed state. For example, example 340 shows a memory cell with a resistor R1 or closed switch representation of CBRAM storage element 208. The CBRAM storage element portion of this representation corresponds to the cross-section diagram 360. In the example 360, electrodeposits 308 can form in solid electrolyte 304 to form a "bridge" or conductive path between electrochemically active electrode 302 and inert electrode 306 to program the memory cell. For example, electrodeposits 308 can be from active electrode 302, and may include silver, copper, titanium, or tellurium, as just a few examples. As shown in example CBRAM storage element 360, a full conductive path may be formed between active electrode 302 and inert electrode 306 by electrodeposits 308.

As shown in examples 300 and 340, a control transistor (e.g., 210) can also be included in each memory cell including the programmable impedance element or CBRAM storage element 208. For example, transistor 210 can be controlled by a word line, as discussed above with respect to FIG. 2. Transistor 210 may be an access transistor to allow CBRAM storage element 208 to be programmed, read, and erased.

Cell data can be erased in similar fashion to cell programming, but with a positive bias on the inert electrode. The metal ions will then migrate away from the filament, back into the electrolyte, and eventually to the negatively-charged active electrode (e.g., 302). This action dissolves the electrodeposits 308 in solid electrolyte 304, and increases the resistance again (e.g., as shown in schematic representation 300). In this way, an erase operation of a CBRAM storage element may be substantially symmetric to a program operation.

Example Memory Array Architecture for Cell Protection During Processing

Figure 4:
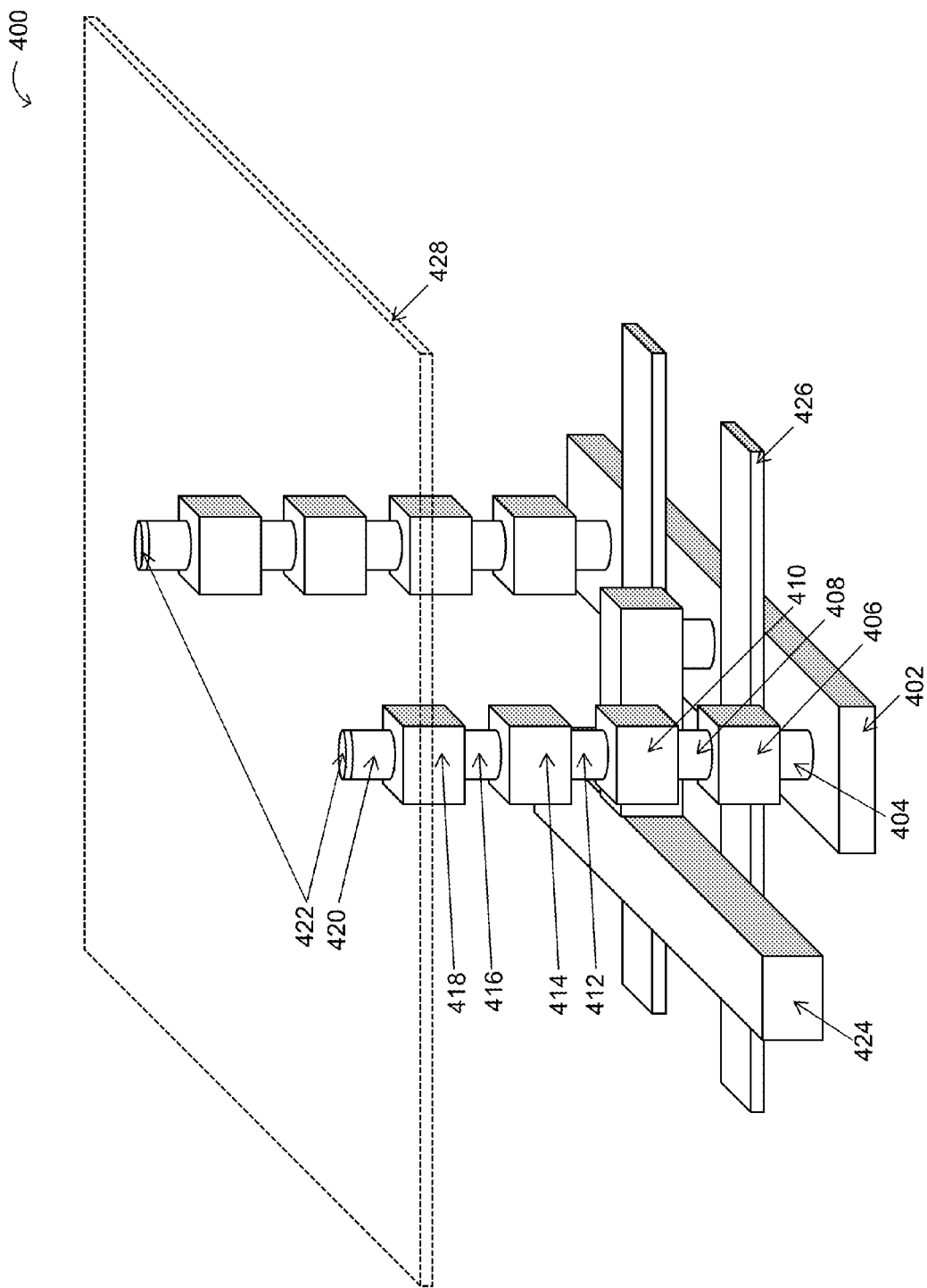
FIG. 4 is a diagram of an example resistive switching memory cell layer arrangement.

Referring now to FIG. 4, shown is a diagram of an example resistive switching memory cell layer arrangement 400. This particular example shows a multilayer metal and via process cross-section to implement a pair of resistive memory cells (e.g., CBRAM cells). Here, source/drain (S/D) region 402 can be an n-type S/D island in a p-substrate. For example, S/D region or island 402 can be surrounded by shallow trench isolation (STI) structures. Contact 404 can connect to metal-1 (M1) portion 406, and via1 408 can connect between M1 portion 406 and metal-2 (M2) portion 410. Also, via2 412 can connect between M2 portion 410 and metal-3 (M3) portion 414, and via3 416 can connect between M3 portion 414 and metal-4 (M4) portion 418. In this way, a standard logic process can be employed in creating at least portions of a resistive switching memory device.

In addition, on top of M4 can be via4 420, which can connect, e.g., to a CBRAM memory cell location 422 (e.g., solid electrolyte 304). Anode plate 428 (e.g., metal oxide+ amorphous alloy layer) can form electrochemically active electrode 302. Further, layers 404, 406, 408, 410, 412, 414, 416, 418, and 420 can form a metal structure for inert electrode 306. In addition, bit line 424 for the pair of resistive memory cells can also reside in metal layer M1, and word lines 426 can be formed of polysilicon that runs orthogonal to the bit lines. While this particular example shows a 5 metal layer process, other suitable arrangements, materials, and/or processes can be utilized in particular embodiments. As will be discussed in more detail below, certain embodiments can include structures that may protect against cell damage during formation (e.g., plasma etching) of anode plate 428.

Figure 5:
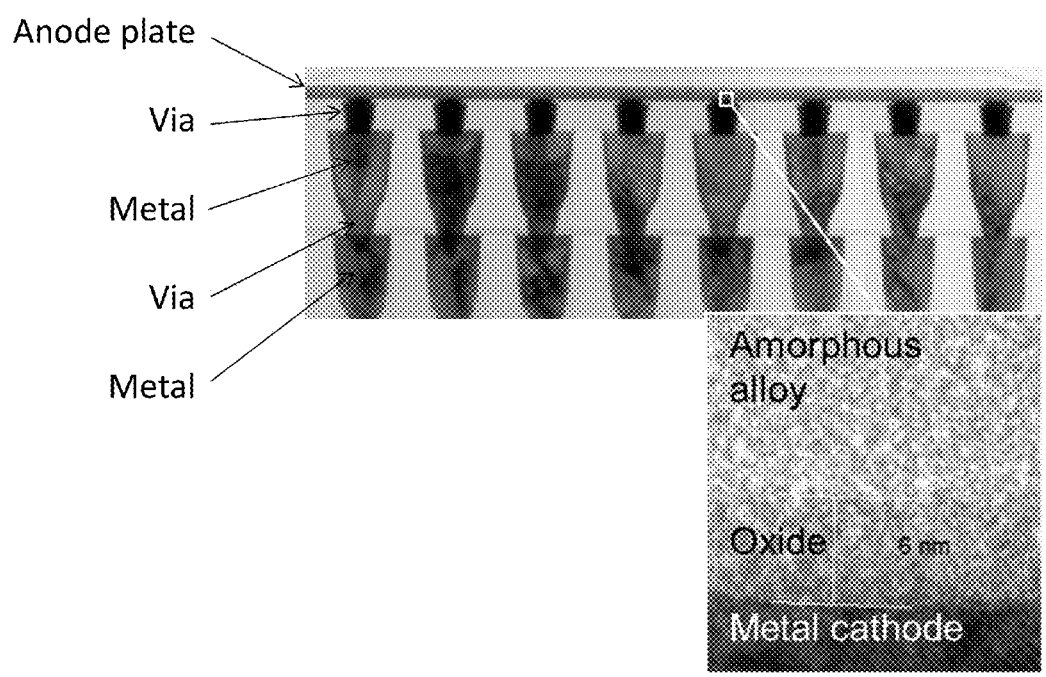
FIG. 5 is a TEM diagram of an example resistive switching memory cell layer arrangement.

Referring now to FIG. 5, shown is a transmission electron microscopy (TEM) diagram 500 of an example resistive switching memory cell layer arrangement. This diagram represents a portion of a TEM of a CBRAM array. Here, the bottom metal layer can correspond to M3 portion 414, and the bottom via (e.g., 416) can connect between M3 portion 414 and a metal layer that can correspond to M4 portion 418. The top via (e.g., 420) can connect to CBRAM memory cell location 422 (e.g., solid electrolyte 304), which can reside under anode plate 428. In the enhanced portion of TEM 500, an amorphous alloy and oxide (e.g., a thickness of about 6 nm) that form anode plate 428, as well as a portion of the metal cathode (e.g., inert electrode 306) are shown. Of course, other arrangements, materials, and/or layer thicknesses, etc., can also be supported in particular embodiments.

Figure 6:
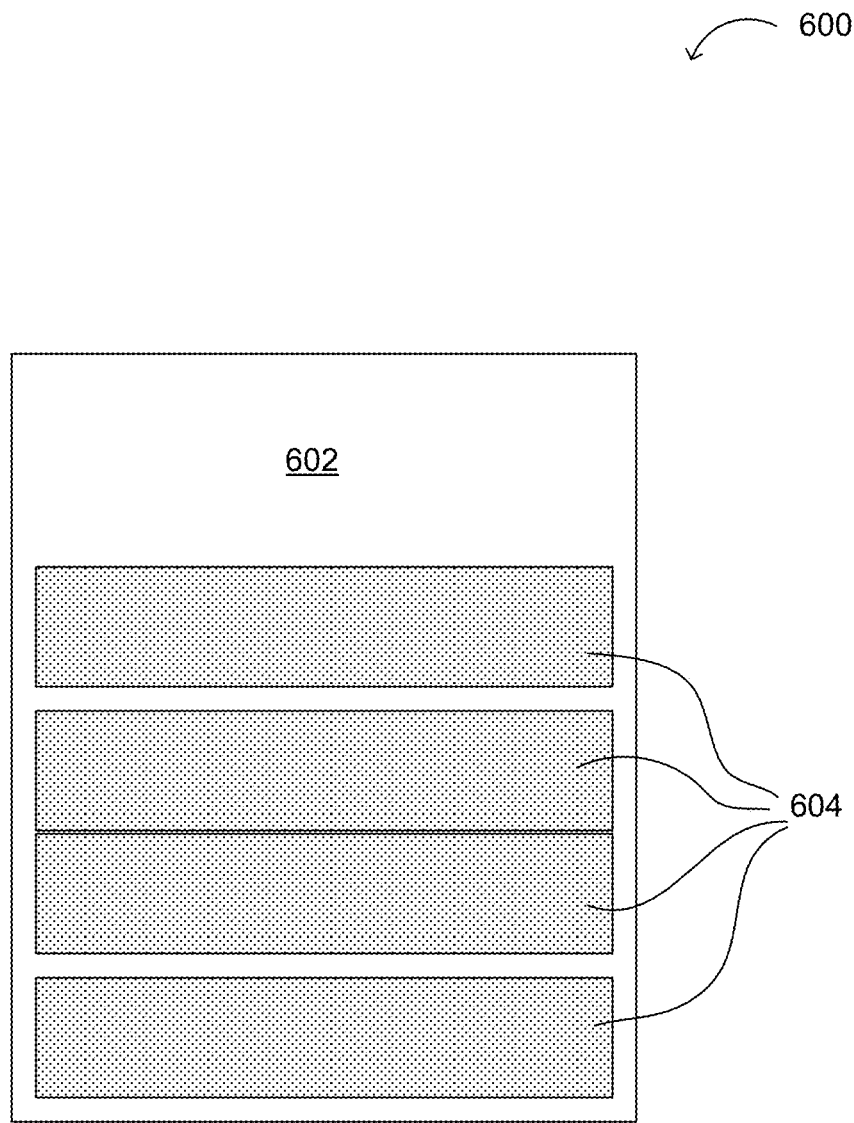
FIG. 6 is a diagram of an example resistive switching memory array arrangement on a chip.

Referring now to FIG. 6, shown is a diagram of an example resistive switching memory array arrangement 600 on a chip or IC. Any suitable memory device architectures or array arrangements can be supported in certain embodiments. In this particular example, area 602 can represent an outer or periphery area with anode plate material that is to be removed by plasma etching. Thus, area 602 after such plasma etching can be devoid of anode plate (e.g., 428) material. During plasma etching, area 602 can behave much like a large antenna that collects plasma charge due to the conductive nature of the anode plate material being etched. In contrast, areas 604 can include CBRAM array areas with anode plate features (e.g., a plurality of anode plates 428) formed by a process that includes plasma etching of unwanted anode plate areas.

Figure 7:
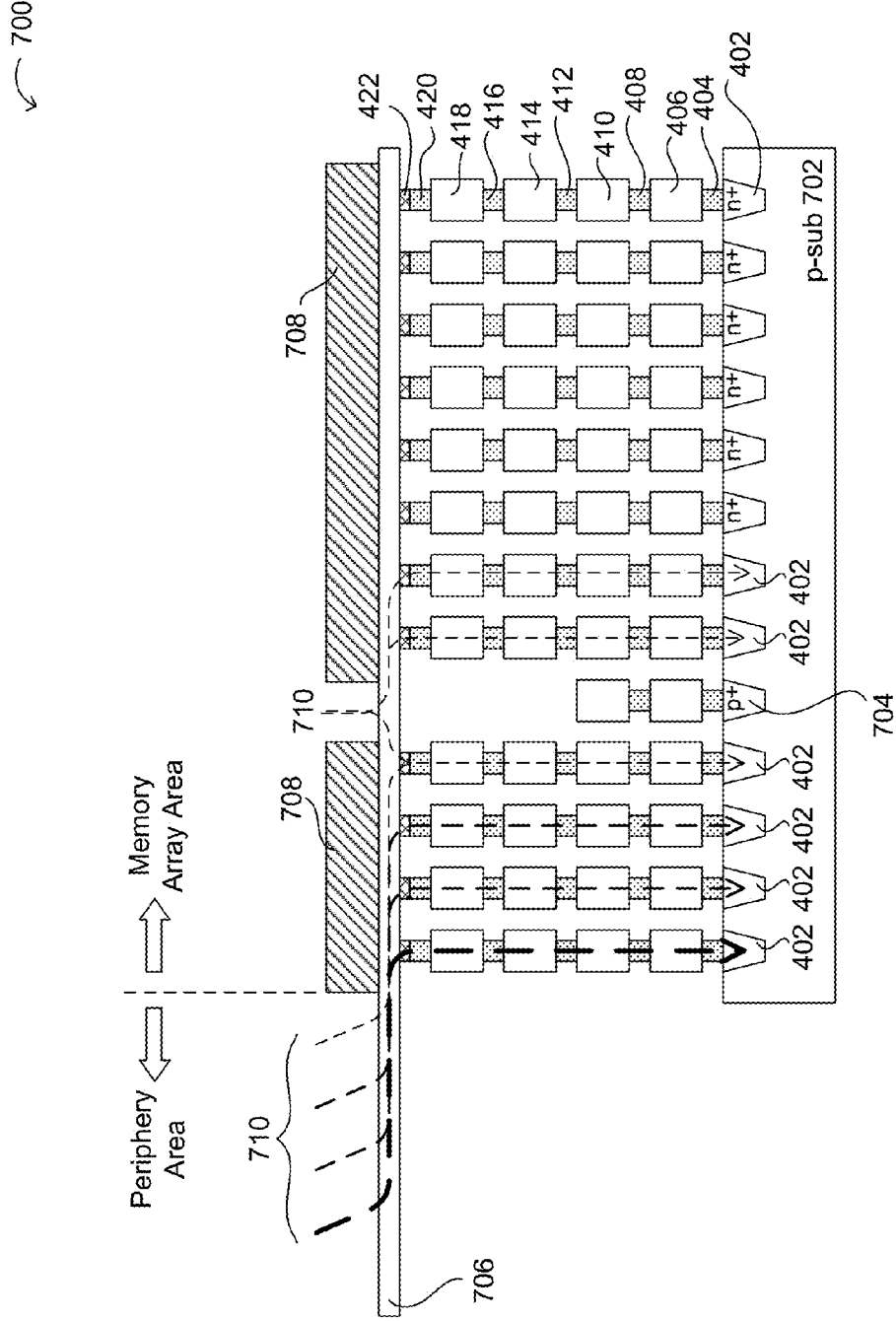
FIG. 7 is a cross-section diagram of an example charge dumping issue in a resistive switching memory device.

Referring now to FIG. 7, shown is a cross-section diagram 700 of an example charge dumping issue in a resistive switching memory device. In this example, a group of memory cells near a memory array area boundary are shown, such as at a border between a periphery area (e.g., 602) and a memory array area (e.g., 604). Here, substrate 702 can be p-type substrate, with n+S/D regions 402, along with p+ well or substrate tap region 704. This diagram also shows anode plate material (e.g., metal oxide+amorphous alloy) 706, which can be etched (e.g., via plasma etching) to form anode plate 428. For example, the etching can be performed based on regions left uncovered by patterned hard mask layer 708. In one case, hard mask layer 708 can include a photoresist, or other hard mask material (e.g., oxide, nitride) that defines anode plate features.

During an etching process for forming anode plate structures for a CBRAM array, the periphery area can act like a relatively large antenna that collects plasma charges. Plasma current 710 can sink to p-substrate 702 through CBRAM cells, particularly at the boundaries of the CBRAM array. Thus as shown, plasma current 710 can be stronger for the memory cells that are closer to a boundary between the memory array and a periphery area, in addition to those surrounding a p+ well tap between anode plates. As a result, cells near the ends or openings of hard mask layer 708 may be more exposed to such plasma current 710 then cells that are more internal to the memory array. Resistive (e.g., CBRAM) cells exposed to charge dumping (e.g., plasma current 710) may experience various undesirable electrical behaviors. For example, out-of-fab initial resistance control on such cells can be lost, cell endurance can be reduced, and/or data retention for affected cells can be degraded.

STI can be provided (e.g., via p+ well tap 704) between anode plates. Also, various metal layers in vias (e.g., 404, 406, 408, 410, 412, 414, 416, 418, and 420) can connect between anode plate 428/706 to n+S/D regions 402. For example, portions of a standard logic process can be utilized to create the memory device, in order to not suppose the resistive storage elements to high processing temperatures. Also, the amorphous alloy in the anode plate can include metal oxide, injection barrier layer (IBL), Ti, TiN, etc., as well as copper, germanium, and/or tellurium, in some cases. As discussed above, the anode plate can include metal in order to drive the metal molecules into solid oxide layer 304 during a cell program operation. In addition, Ti+TiN can be included to increase conductivity, as well as to improve the functionality of IBL in the anode plate.

As shown above in FIG. 5, an amorphous alloy can be on an oxide layer to form the material of the anode plate. For example, a chemical vapor deposition (CVD) machine or a sputtering machine can be used to form the oxide layer, then the IBL, and so on, in order to form a stack of materials for the anode plate. Such materials may initially cover the entire wafer, and then defined portions (e.g., via a hard mask) thereof can be removed to define various circuitry features and/or chip portions. Anode plates can be broken into strips or other portions or arrangements, and may be defined by patterned photoresist and subsequent etching of the anode plate material. For example, the photoresist can include a hard mask (e.g., oxide, nitride, etc.), which can be exposed to define patterns for the anode plate to be formed via subsequent etching.

In some cases, a dry etching approach may be utilized to operate with plasma (e.g., with charged particles). When performing etching, the charged particles can etch areas of anode material 706 that are left uncovered or exposed by patterned photoresist 708. Peripheral circuitry (e.g., clocks, control circuitry) may not have features that are as dense as the memory array, and these areas may be left uncovered by hard mask 708 because they also do not contain an anode plate. As discussed above, antenna effects can sink current from charged particles during plasma etching, and the particle path can discharge to substrate 702.

Effects of such plasma particle discharge can be more pronounced in outside areas or edge regions where photoresist 708 has been removed (e.g., by UV exposure). Photoresist after patterning may only cover areas to be protected from plasma etching, and where the anode plates (e.g., 428) are to be retained and formed. This can represent the process of defining the anode plate for a group (e.g., an array or sub-array) of resistive memory cells. Thus, anode plate (e.g., including IBL) layer 706 can be deposited all over a surface of a wafer/chip, and then etched to form anode plate structures 428. Also, a chuck under the wafer can be grounded during the plasma etching process, and positively charged plasma can go to the substrate (e.g., p-type), which can be grounded.

Figure 8:
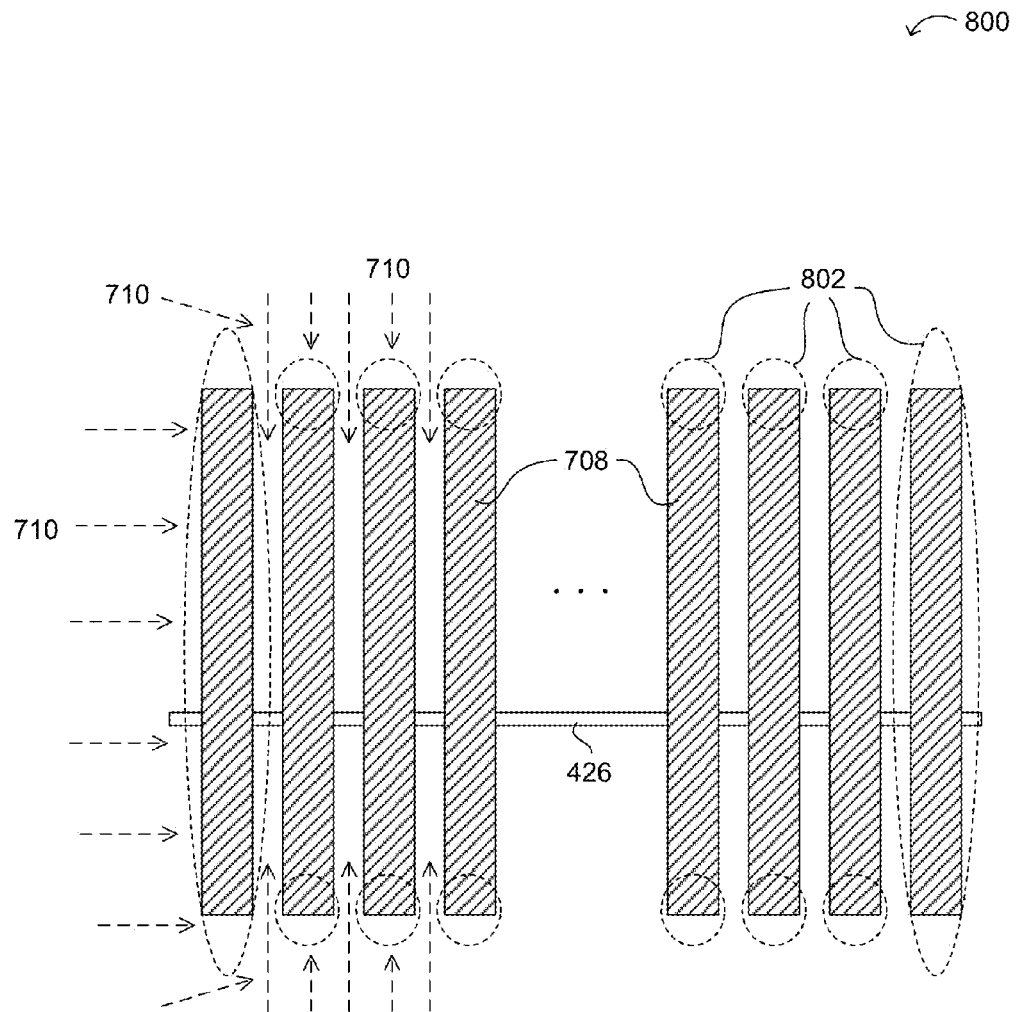
FIG. 8 is a top level diagram of an example charge dumping issue in a resistive switching memory device.

Referring now to FIG. 8, shown is a top level diagram 800 that exemplifies a charge dumping issue in a resistive switching memory device. Here, patterned hard mask layer portions 708 are shown from a top level view, and portions 708 can define anode plate areas 428. Plasma induced current 710 can cause more severe charge dumping stress in CBRAM cells 802 that are located at and near the boundaries of the array and/or edges of patterned hard mask layer 708. The left and right sides of the drawing example of FIG. 8 show that such a charge dumping effect can be most severe for cells located along the boundary of a memory (e.g., CBRAM) array.

Charge dumping through a CBRAM or other resistive memory cell can result in various types of undesirable electrical behavior. For example, reduced control of R0 (virgin cell or initial resistance) can occur. In some cases, this can lowering of the initial resistance can be significant such that a virgin memory cell appears already (at least partially) programmed. Another potential effect of charge dumping is a reduction in the endurance of the affected memory cell. For example, such a damaged memory cell may not be able to sustain a certain number of program and erase cycles. Another potential effect of charge dumping is a degradation in the data retention capabilities of an affected memory cell. Thus, a non-uniform charge dumping situation as illustrated in the example of FIG. 8 may result in significant die yield reduction, such as due to failure of initial R0, and/or other screenings or test failures.

In one embodiment, a resistive switching memory device can include: (i) a plurality of resistive memory cells arranged in a plurality of array blocks, where each resistive memory cell is configured to be programmed to a low resistance state by application of a program voltage in a forward bias direction, and to be erased to a high resistance state by application of an erase voltage in a reverse bias direction; (ii) a plurality of anode plates corresponding to the plurality of array blocks, where each resistive memory cell can include a resistive storage element having an anode coupled to one of the anode plates; (iii) an inactive ring surrounding the plurality of anode plates, where the inactive ring can include a same material as each of the plurality of anode plates; and (iv) a plurality of boundary cells located under the inactive ring.

Figure 9:
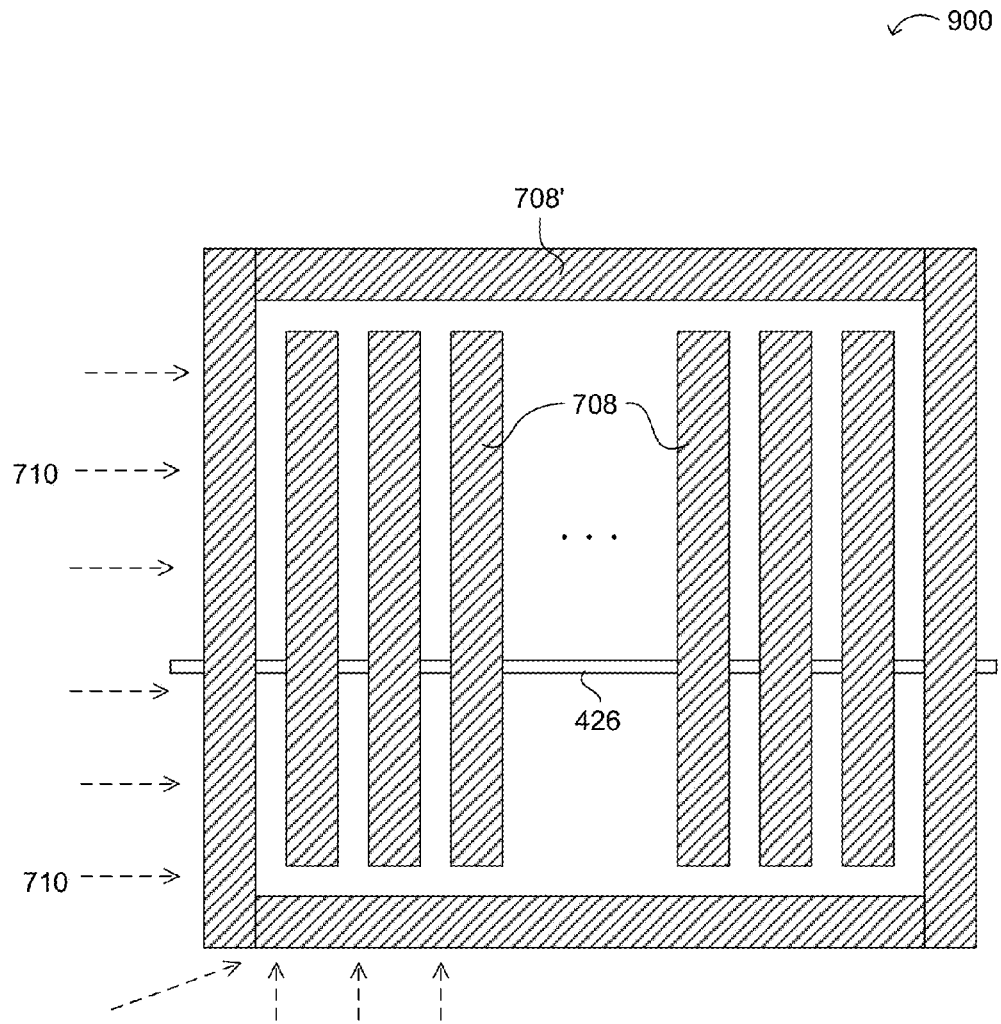
FIG. 9 is a top level diagram of an example inactive ring in a resistive switching memory device, in accordance with embodiments of the present invention.

Referring now to FIG. 9, shown is a top level diagram 900 of an example inactive ring in a resistive switching memory device, in accordance with embodiments of the present invention. In this example, an unbroken ring of a "dummy" or "boundary" anode plate feature can surround the CBRAM array, and may be formed by using patterned hard mask ring portion 708'. Thus, an unbroken anode plate ring (formed under hard mask ring 708') can be utilized to essentially block plasma induced current from damaging other cells in the memory array or periphery area. Thus, to minimize charge dumping during plasma processing (e.g., etching of anode plate material 706), an inactive (e.g., IBL, etc.) ring feature can be formed to surround a memory (e.g., CBRAM) array. In addition, boundary cells (e.g., including boundary word lines, bit lines, etc.) can be formed under the inactive ring structure. For example, a width of hard mask ring 708' can be substantially the same width all around the memory array. Also, any suitable number of boundary cells (e.g., 2, 4, 6, etc.) can be formed under the ring, and the ring can surround an array block, or other array structure of resistive memory cells.

Figure 10:
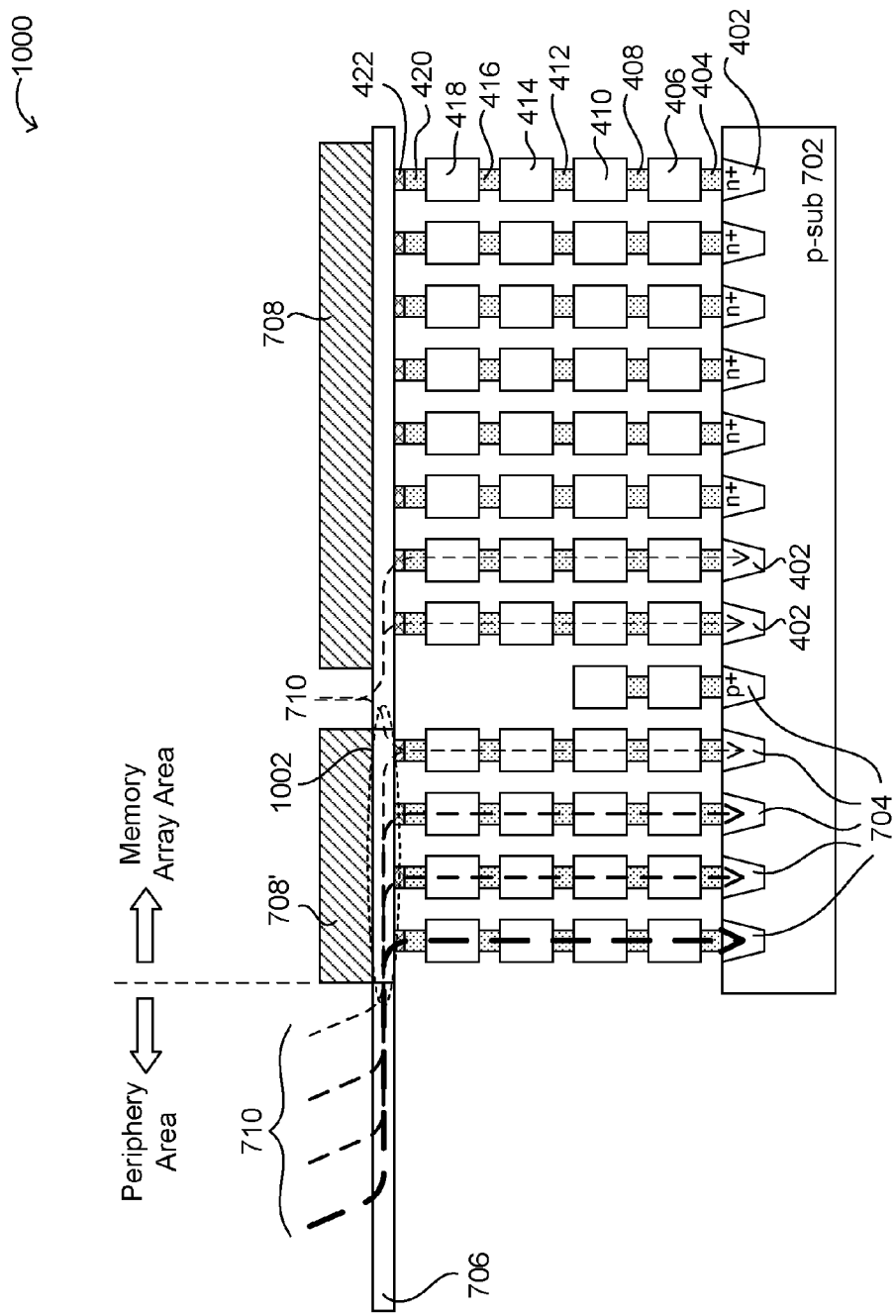
FIG. 10 is a cross-section diagram of an example inactive ring with boundary cells in a resistive switching memory device, in accordance with embodiments of the present invention.

Referring now to FIG. 10, shown is a cross-section diagram 1000 of an example inactive ring with boundary cells in a resistive switching memory device, in accordance with embodiments of the present invention. In this example, the boundary (inactive) anode ring portion can be defined by hard mask 708'. In addition, the boundary cells (e.g., CBRAM cells) under the boundary inactive ring structure (e.g., 1002) defined by hard mask 708' can include cells that connect to p-substrate 702 through p-type junctions 704 that are similar to a p-well tap or connection. For example, p-type junction(s) 704 can be a completed (e.g., solid) or broken (e.g., segmented) S/D ring that surrounds the CBRAM array.

In particular embodiments, such a non-active (e.g., including IBL) ring may not have any breaks, and can thus form a contiguous surrounding ring-like or square boundary structure. Also, the ring can be connected to at least one p-type junction 704 in substrate 702. Further, the p+S/D regions (e.g., 704) of the boundary cells can be connected to p-substrate 702. Thus, while a regular resistive memory (e.g., CBRAM) cell may have an n+ junction for the NMOS access transistor (e.g., 210), the boundary cells formed under hard mask ring 708' may have p+ region(s) 704 in p-substrate 702, thus appearing like a well contact or tap. This minimizes the junction barrier, so the resistance of the boundary cell can be less than that of a regular resistive memory cell, and as such may discharge a higher plasma current 710. Because a p-n junction has a depletion layer barrier to overcome, and the boundary cells may not have such a barrier, the boundary cells can sink more plasma current 710, thus can more effectively spare regular resistive memory cells from damage during plasma etching to form the anode plates.

In one embodiment, a method of making a resistive switching memory device can include: (i) forming a plurality of resistive memory cells arranged in a plurality of array blocks, where each resistive memory cell is configured to be programmed to a low resistance state by application of a program voltage in a forward bias direction, and to be erased to a high resistance state by application of an erase voltage in a reverse bias direction; (ii) forming a plurality of anode plates corresponding to the plurality of array blocks, where each resistive memory cell can include a resistive storage element having an anode coupled to one of the anode plates; (iii) forming an inactive ring surrounding the plurality of anode plates, where the inactive ring can include a same material as each of the plurality of anode plates; and (iv) forming a plurality of boundary cells located under the inactive ring.

Figure 11:
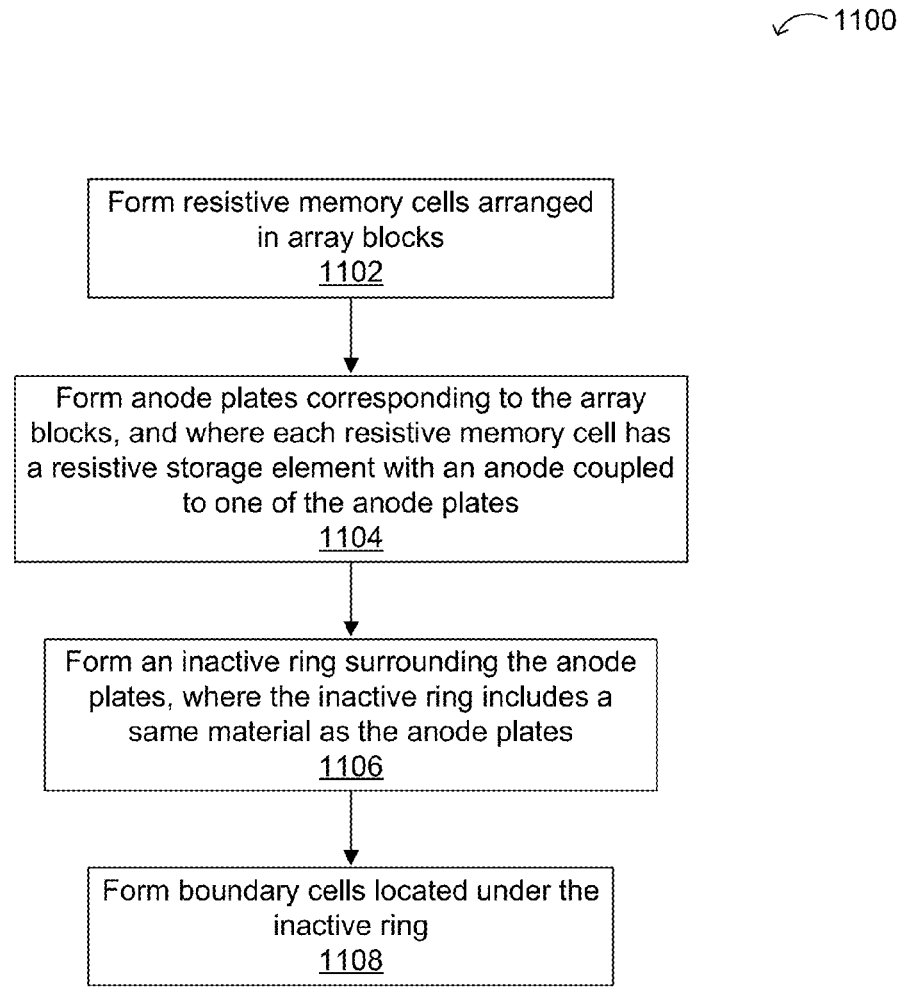
FIG. 11 is a flow diagram of an example method of making a resistive switching memory device, in accordance with embodiments of the present invention.

Referring now to FIG. 11, shown is a flow diagram of an example method of making a resistive switching memory device, in accordance with embodiments of the present invention. At 1102, resistive memory cells (see, e.g., FIG. 4) arranged in array blocks (see, e.g., FIG. 6) can be formed. For example, each resistive memory cell can be configured to be programmed to a low resistance state by application of a program voltage in a forward bias direction, and to be erased to a high resistance state by application of an erase voltage in a reverse bias direction. At 1104, anode plates can be formed corresponding to the array blocks. For example, anode plate material 706 (e.g., metal oxide, IBL, etc.) can be deposited on a surface of a wafer. Next, photoresist or hard mask can be deposited and patterned (e.g., 708) to expose areas of the anode plate material to be retained after plasma etching.

For example, each resistive memory cell can include a resistive storage element having an anode coupled to at least one of the anode plates. At 1106, an inactive or boundary ring surrounding the anode plates can be formed. For example, the inactive ring can include a same material (e.g., metal oxide, IBL, etc.) as each of the anode plates. Also, the inactive ring can be formed along with (e.g., at a same time as) the anode plates. For example, anode plate material 706 (e.g., metal oxide, IBL, etc.) can be deposited on a surface of a wafer. Next, a photoresist or hard mask can be deposited and patterned (e.g., 708') to expose areas of the anode plate material to be retained after plasma etching.

At 1108, boundary cells located under the inactive ring can be formed. As discussed above, the boundary cells can include p+ regions 704 that can connect to p-substrate 702. Also, other layers (e.g., 404, 406, 408, 410, 412, 414, 416, 418, 420, 422, etc.) can be formed as part of creating the boundary cells. Further, one skilled in the art will recognize that the ordering of the steps shown in the example of FIG. 11 may not be sequential as may be indicated in the diagram. In contrast, 1108 to form the boundary cells can occur along with 1102 to form the regular resistive memory cells. In addition, 1106 to form the inactive ring can occur along with anode plate formation in 1104. Thus, memory cell formation, including boundary cell formation can occur substantially simultaneously, followed by anode plate and inactive ring formation, which can also occur substantially simultaneously.

Figure 12:
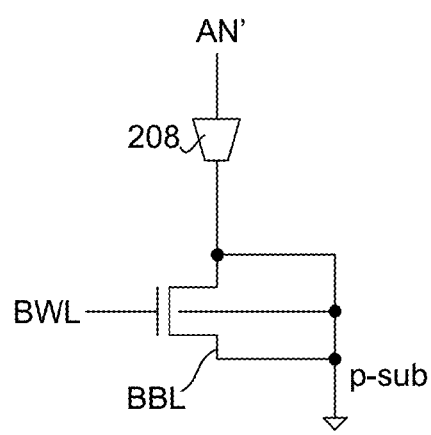
FIG. 12 is a schematic diagram of an example boundary cell located under an inactive anode plate ring, in accordance with embodiments of the present invention.

Referring now to FIG. 12, shown is a schematic diagram of an example boundary cell 1200, which can be located under an inactive anode plate ring, in accordance with embodiments of the present invention. In this particular example, the resistive memory element 208 can be substantially the same as regular resistive memory cells (see, e.g., FIG. 2). However, the anode plate connection may be to the inactive anode material ring that may be formed due to patterned hard mask portion 708'. Further, the inactive ring can be denoted as AN', and a voltage on the inactive ring can be floating, or AN' may be connected to a predetermined or controlled voltage (e.g., to the same level as a corresponding anode plate voltage, VAN).

Also in the boundary memory cell is a boundary word line (BWL) connection to the gate of the structure. For example, the BWL can be driven along with other word lines, and in some cases may be connected to word lines for regular resistive memory cells in the array (see, e.g., WL 426 in FIG. 9). Boundary bit line (BBL) can be connected, along with the other source/drain (S/D) region of the access device, to the p-substrate (e.g., 702). For example, each boundary cell S/D region (e.g., 704) can be a p+ region, and may connect as a well tap to the p-substrate.

In particular embodiments, the inactive anode plate material ring can make the cells (e.g., CBRAM cells) within an array behave in a more uniform fashion. In addition, such cells may show improvement in endurance and data retention capabilities, as compared to other corresponding cells located at edges of arrays or anode plates. Also due to the inactive anode plate material ring of certain embodiments, a relatively small number of boundary cells (e.g., 4), including associated word lines and bit lines, can be employed, thus maximizing effective resistive memory cell area.

Resistive switching memory cells as discussed herein may also each support more than one memory state. In addition, depending on the voltage level controls, instead of a full erase or a full program/write, partial operations (e.g., by applying less/predetermined voltages for forward bias and reverse bias of the CBRAM cell, by applying different program current, etc.) can be performed. Such partial operations can produce different resistance and linear/nonlinear values in the cell, as opposed to the cell having an on/off resistance corresponding to two storage states. Instead, a binary coding of, e.g., eight different bands or ranges of CBRAM cell on resistances can be converted into 3-bit storage values. Thus in this example, eight different data values can be stored in a given CBRAM cell. Of course, other numbers of data values can be stored based on the resistance, linearity, bias voltage, and/or current characteristics.

While the above examples include circuit, operational, and structural implementations of certain memory cells and programmable impedance devices, one skilled in the art will recognize that other technologies and/or cell structures can be used in accordance with embodiments. Further, one skilled in the art will recognize that other device circuit arrangements, architectures, elements, and the like, may also be used in accordance with embodiments. Further, the resistance levels, operating conditions, and the like, may be dependent on the retention, endurance, switching speed, and variation requirements of a programmable impedance element.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of making a resistive switching memory device, the method comprising:
   a) forming a plurality of resistive memory cells arranged in a plurality of array blocks, wherein each resistive memory cell is configured to be programmed to a low resistance state by application of a program voltage in a forward bias direction, and to be erased to a high resistance state by application of an erase voltage in a reverse bias direction;
   b) forming a plurality of anode plates corresponding to the plurality of array blocks, wherein each resistive memory cell comprises a resistive storage element having an anode coupled to one of the anode plates;
   c) forming an inactive ring surrounding the plurality of anode plates, wherein the inactive ring comprises a same material as each of the plurality of anode plates; and
   d) forming a plurality of boundary cells located under the inactive ring.

2. The method of claim 1 wherein the same material comprises a metal oxide.

3. The method of claim 1, wherein the same material comprises an injection barrier layer (IBL).

4. The method of claim 1, wherein the same material comprises titanium.

5. The method of claim 1, wherein the same material comprises titanium nitride.

6. The method of claim 1, wherein each resistive memory cell comprises n+ regions in a p-substrate.

7. The method of claim 6, wherein each boundary cell comprises p+ regions in the p-substrate.

8. The method of claim 1, further comprising connecting the inactive ring to a p-substrate of the resistive switching memory device.

9. The method of claim 1, wherein the forming the plurality of anode plates and the inactive ring comprises:
   a) depositing the same material on a surface of the resistive switching memory device;
   b) patterning a hard mask layer on the same material to define regions for the plurality of anode plates and the inactive ring; and
   c) using plasma etching to remove the same material from areas not covered by the patterned hard mask layer, wherein the plurality of boundary cells are configured to sink current from the plasma etching.

10. The method of claim 1, wherein the resistive storage element comprises a conductive bridging random-access memory (CBRAM) storage element.

* * * * *